United States Patent
Chu et al.

(10) Patent No.: US 7,509,243 B2
(45) Date of Patent: Mar. 24, 2009

(54) METHOD OF DETERMINING HIGH-SPEED VLSI REDUCED-ORDER INTERCONNECT BY NON-SYMMETRIC LANCZOS ALGORITHM

(75) Inventors: Chia-Chi Chu, Tao-Yuan (TW);
Ming-Hong Lai, Tao-Yuan (TW);
Wu-Shiung Feng, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 267 days.

(21) Appl. No.: 11/148,086

(22) Filed: Jun. 8, 2005

(65) Prior Publication Data
US 2006/0282799 A1 Dec. 14, 2006

(51) Int. Cl.
*G06F 17/10* (2006.01)
*G06F 17/50* (2006.01)

(52) U.S. Cl. ............................................. 703/2; 703/14
(58) Field of Classification Search ...................... 703/2, 703/14
See application file for complete search history.

(56) References Cited

U.S. PATENT DOCUMENTS

| | | | |
|---|---|---|---|
| 6,023,573 A | 2/2000 | Bai et al. | 395/500.23 |
| 6,041,170 A | 3/2000 | Feldmann et al. | 395/500.23 |
| 6,135,649 A | 10/2000 | Feldmann et al. | 395/500.35 |
| 6,460,165 B1 | 10/2002 | Ismail et al. | 716/1 |
| 6,687,658 B1 | 2/2004 | Roychowdhury | 703/2 |
| 6,789,237 B1 | 9/2004 | Ismail | 716/4 |
| 6,810,506 B1 | 10/2004 | Levy | 716/2 |

OTHER PUBLICATIONS

Bai et al.; Reduced Order Modeling; Numerical Analysis Manuscript No. 02-4-13; Bell Laboratories, Murray Hill. New Jersey; Mar. 2002, Available on WWW at http://cmbell-labs.com/cs/doc/02; pp. 1-59.*

* cited by examiner

*Primary Examiner*—Hugh Jones
(74) *Attorney, Agent, or Firm*—Alan Kamrath; Kamrath & Associates PA (57) ABSTRACT

Two-sided projection-based model reductions have become a necessity for efficient interconnect modeling and simulations in VLSI design. In order to choose the order of the reduced system that can really reflect the essential dynamics of the original interconnect, the element of reduced model of the transfer function can be considered as a stopping criteria to terminate the non-symmetric Lanczos iteration process. Furthermore, the approximate transfer function can also be expressed as the original interconnect model with some additive perturbations. The perturbation matrix only involves at most a rank-2 modification at the previous step of the non-symmetric algorithm. The information of stopping criteria will provide a guideline for the order selection scheme used in the Lanczos model-order reduction algorithm.

2 Claims, 8 Drawing Sheets

1. Set $\beta_1 = \sqrt{|cb|}$ and $\delta_1 = \beta_1 \cdot sign(cb)$
2. Define $v_1 = b/\delta_1$ and $w_1 = c'/\beta_1$
3. Let $V_q = [v_1]$, and $W_q = [w_1]$
4. for $i = 1, 2, \cdots, q-1$, do
4.1 $\alpha_i = w_i' A v_i$
4.2 $\hat{v}_{i+1} = A v_i - \alpha_i v_i - \beta_i v_{i-1}$
4.3 $\hat{w}_{i+1} = A' w_i - \alpha_i w_i - \delta_i w_{i-1}$
4.4 $\beta_{i+1} = \sqrt{|\hat{w}_{i+1}' \hat{v}_{i+1}|}$, $\delta_{i+1} = \beta_{i+1} \cdot sign(\hat{w}_{i+1}' \hat{v}_{i+1})$
4.5 $v_{i+1} = \hat{v}_{i+1}/\delta_{i+1}$, and $w_{i+1} = \hat{w}_{i+1}/\beta_{i+1}$
4.6 $V_q = [V_q \quad v_{i+1}]$ and $W_q = [W_q \quad w_{i+1}]$ Fig.1
PRIOR ART

Fig.2

1. Set $\beta_1 = \sqrt{|cb|}$ and $\delta_1 = \beta_1 \cdot sign(cb)$
2. Define $v_1 = b/\delta_1$ and $w_1 = c'/\beta_1$
3. Let $V_q = [v_1]$ and $W_q = [w_1]$
4. for $q = 1, 2, \Lambda$, do
4.1    $\alpha_q = w_q' A v_q$
4.2    $\hat{v}_{q+1} = A v_q - \alpha_q v_q - \beta_q v_{q-1}$
4.3    $\hat{w}_{q+1} = A' w_q - \alpha_q w_q - \delta_q w_{q-1}$
4.4    $\beta_{q+1} = \sqrt{|\hat{w}_{q+1}' \hat{v}_{q+1}|}$, $\delta_{q+1} = \beta_{q+1} \cdot sign(\hat{w}_{q+1}' \hat{v}_{q+1})$
4.5    $v_{q+1} = \hat{v}_{q+1}/\delta_{q+1}$, and $w_{q+1} = \hat{w}_{q+1}/\beta_{q+1}$
4.6    $V_q = [V_q \; v_{q+1}]$ and $W_q = [W_q \; w_{q+1}]$
4.7    if $\lambda_q = \left\|\frac{\delta_{q+1}}{AV_q}\right\| \leq tol.$ and $\mu_q = \left\|\frac{\beta_{q+1}}{A'W_q}\right\| \leq tol.$
4.7.1      return;

METHOD OF DETERMINING HIGH-SPEED VLSI REDUCED-ORDER INTERCONNECT BY NON-SYMMETRIC LANCZOS ALGORITHM

BACKGROUND OF THE INVENTION

1. Field of the Invention

The present invention relates generally to a reduced-order circuit model and, more particularly, to a rapid and accurate reduced-order interconnect circuit model which can be used for signal analysis of a high-speed and very-large IC interconnect.

2. Description of Related Art

With rapid development of semiconductor techniques, the parasitic effect has no longer been ignored during design of high-speed and very-large IC interconnect. This technology was proposed in 2002 by M. Celik, L. T. and A. Odabasioglu "IC Interconnect Analysis," Kluwer Academic Publisher.

Given the fact of more complex circuits, the corresponding order of mathematical models will be increased in order to accurately simulate the characteristics of interconnect circuits. Therefore, an efficient model reduction method has become a necessary know-how for interconnect modeling and simulation. The well-proven technologies, such as U.S. Pat. Nos. 6,789,237, 6,687,658, 6,460,165, 6,135,649, 6,041,170, 6,023,573, are proposed in 2000 by R. W. Freund, "Krylov-Subspace Methods for Reduced-Order Modeling in Circuit Simulation," Journal of Computational and Applied Mathematics, Vol. 123, pp. 395-421; in 2002 by J. M. Wang, C. C. Chu, Q. Yu and E. S. Khu, "On Projection Based Algorithms for Model Order Reduction of Interconnects," IEEE Trans. on Circuits and Systems-I: Fundamental Theory and Applications, Vol. 49, No. 11, pp. 1563-1585.

In recent years, the common methods for circuit model reduction include:

Asymptotic Waveform Evaluation (AWE)(L. T. Pillage and R. A. Rohrer, "Asymptotic waveform evaluation for timing analysis," IEEE Trans. on Computer-Aided Design of Integrated Circuits and Systems, Vol. 9, No. 4, pp. 352-366, 1990);

PVL (Pade via Lanczos)(P. Feldmann and R. W. Freund, "Efficient linear circuit analysis by Pad'e approximation via the Lanczos process," IEEE Trans. on Computer-Aided Design of Integrated Circuits and Systems, Vol. 14 pp. 639-649, 1995);

SyMPVL (Symmetric Matrix Pade via Lanczos)(P. Feldmann and R. W. Freund, "The SyMPVL algorithm and its applications to interconnect simulation," Proc. 1997 Int. Conf. on Simulation of Semiconductor Processes and Devices, pp. 113-116, 1997);

Arnoldi Algorithm (e.g. U.S. Pat. No. 6,810,506); and

PRIMA (Passive Reduced-order Interconnect Macromodeling Algorithm)(A. Odabasioglu, M. Celik and L. T. Pileggi, "PRIMA: passive reduced-order interconnect macromodeling algorithm," IEEE Trans. on Computer-Aided Design of Integrated Circuits and Systems, Vol. 17 pp. 645-653, 1998).

All of the aforementioned model reduction techniques employ a Krylov Subspace Projection Method, which utilizes a projection operator to obtain the state variables of the reduced circuit system after projecting the state variable of the original circuit system. The projection operator is established by the Krylov Algorithm iteration process, of which the order of the reduced circuit is the number of iteration. For the model reduction algorithm of the applied projection method, another important job is to determine the order of the reduced circuit, since it is required to find out an appropriate order such that the reduced circuit can reflect accurately important dynamic behavior of the original circuit.

SUMMARY OF THE INVENTION

The present invention provides an improved non-symmetric Lanczos Algorithm. Based on error estimation of a reduced model of a linear circuit and original model, it should thus be possible for improvement of a submicron IC interconnect model.

The present invention will present a detailed description of the relationship between the original circuit system and the reduced circuit system, wherein the reduced circuit obtains a project-based matrix and then a reduced-order circuit model by employing a non-symmetric Lanzcos Algorithm. Based on $\delta_{q+1}$ and $\beta_{q+1}$ calculated by the algorithm, it is required to set a termination iteration condition in order to obtain a balance point between complexity of computation and accuracy of the reduced model.

In addition, the present invention will prove that, after transfer function of the original circuit is added with some additive perturbations, the moment of transfer function fully matches that of the reduced model by employing the non-symmetric Lanczos Algorithm in various orders. Since well-proven technology has demonstrated that q-th moments of the reduced system are equivalent to those of the original system, q-th order moments of the original system plus the perturbed system are equivalent to those of the original system. The perturbation matrix is related to the component generated by the non-symmetric Lanczos Algorithm, with the cyclomatic number being up to 2, so no additional computational resources are required. The algorithm of the present invention will provide an efficient guideline of selecting a reduced-order circuit by the Krylov Subspace Model Reduction Algorithm.

In a certain embodiment, the present invention has a simplified circuit model by employing the non-symmetric Lanczos Algorithm, which includes the following steps: (1) input a mesh circuit; (2) input an expand frequency point; (3) set up a state space matrix of the circuit; and (4) reduce a submicron IC interconnect model by employing an improved non-symmetric Lanczos Algorithm.

DESCRIPTION OF THE MAIN COMPONENTS (102) Original system
(104) Reduced order q=1

(106) Bi-orthogonal $v_q$ and $w_q$ of the non-symmetric Lanczos Algorithm (108) Solution of $\delta_{q+1}$, $\beta_{q+1}$ $$\lambda_q = \left\|\frac{\delta_{q+1}}{AV_q}\right\| \le \varepsilon \text{ and } \left\|\frac{\beta_{q+1}}{A'W_q}\right\| \le \varepsilon \qquad (110)$$

(112) q++

(114) Calculate the model of the reduced system

DETAILED DESCRIPTION OF THE INVENTION

The conventional methods, such as Modified Nodal Analysis (MNA), Kirchhoff's Voltage Law (KVL) and Kirchhoff's Current Law (KCL), are used for analyzing the characteristics of very-large IC interconnects. The circuits can be expressed as the following state space matrixes:

$$M\frac{dx(t)}{dt} = -Nx(t) + bu(t), \quad y(t) = c^T x(t), \qquad (1)$$

Where, M, N $\in R^{n \times n}$, x,b,c $\in R^n$ and y(t) $\in R^n$. Matrix M comprises capacitance C and inductance L, matrix N comprises conductance G and resistance R, state matrix x(t) comprises node voltage and branch current, u(t) is an input signal, and y(t) is an output signal. Assuming $A=-N^{-1}M$ and $r=N^{-1}b$, formula (1) can be expressed as:

$$A\frac{dx(t)}{dt} = x(t) - ru(t), \quad y(t) = c^T x(t), \qquad (2)$$

Model order reduction aims to reduce the order of the circuit system and to reflect efficiently the reduced circuit system of the original circuit system. The state space matrix of the reduced circuit can be expressed as:

$$\hat{A}\frac{d\hat{x}(t)}{dt} = \hat{x}(t) - \hat{r}u(t), \quad \hat{y}(t) = \hat{c}^T \hat{x}(t), \qquad (3)$$

Where, $\hat{x}(t) \in R^q$, $\hat{A} \in R^{q \times q}$, $\hat{r}, \hat{c} \in R^q$ and q<<n.

Assuming $X(s)=L[x(t)]$ and $\hat{X}(s)=L[\hat{x}(t)]$ are pulse responses of the original system and the reduced system in a Laplace Domain, X(s) and $\hat{X}(s)$ can be expressed as follows:

$$X(s)=(I_n-sA)^{-1}r; \hat{X}(s)=(I_q-s\hat{A})^{-1}\hat{r} \qquad (4)$$

Where $I_n$ is a unit matrix of n×n, and $I_m$ is a unit matrix of q×q. The transfer function H(s) of the original system and the transfer function $\hat{H}(s)$ of the reduced system can be expressed separately as:

$$H(s)=c^T X(s)=c^T(I_n-sA)^{-1}r \qquad (5)$$

and $$\hat{H}(s)=\hat{c}^T \hat{X}(s)=\hat{c}^T(I_q-s\hat{A})^{-1}\hat{r} \qquad (6)$$

Modeling Reduction Technique

Figure 1:
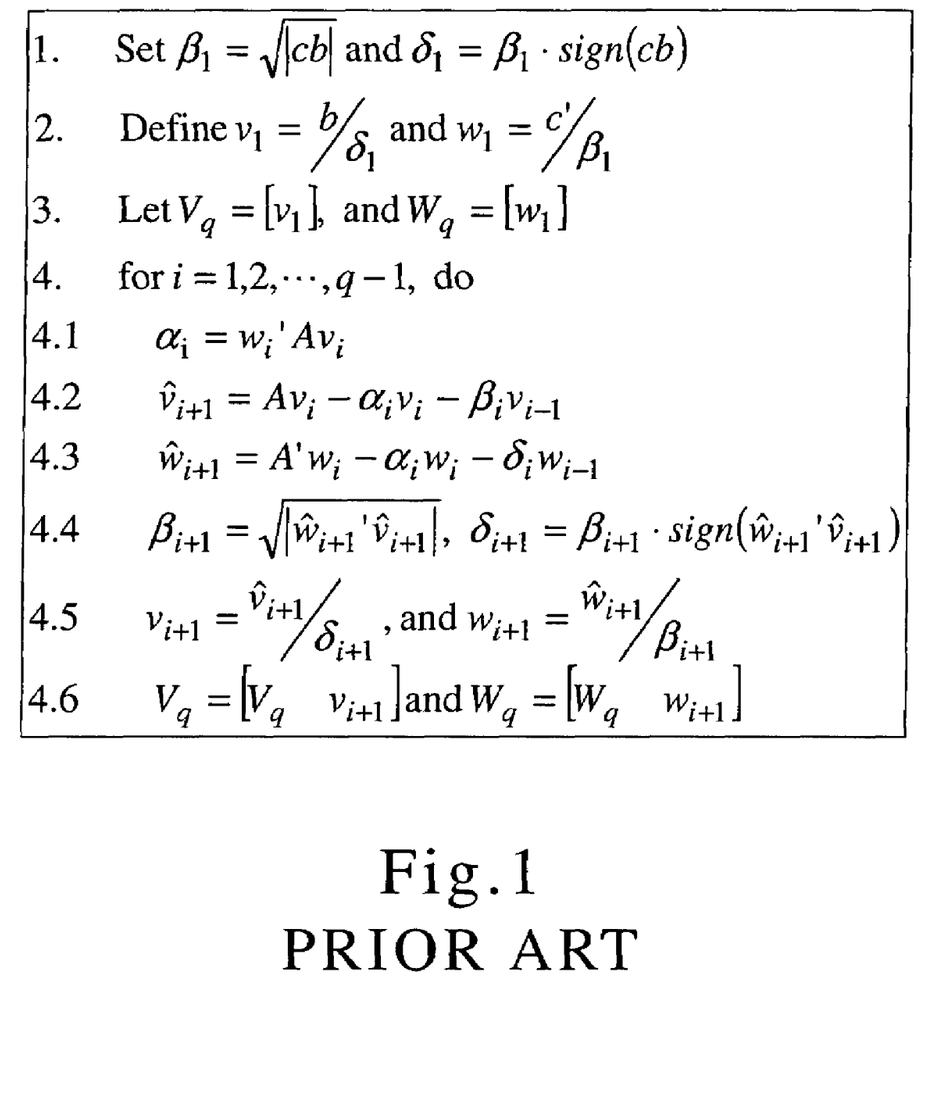
FIG. 1 shows the pseudo code of the traditional non-symmetric Lanczos Algorithm.
Figure 2:
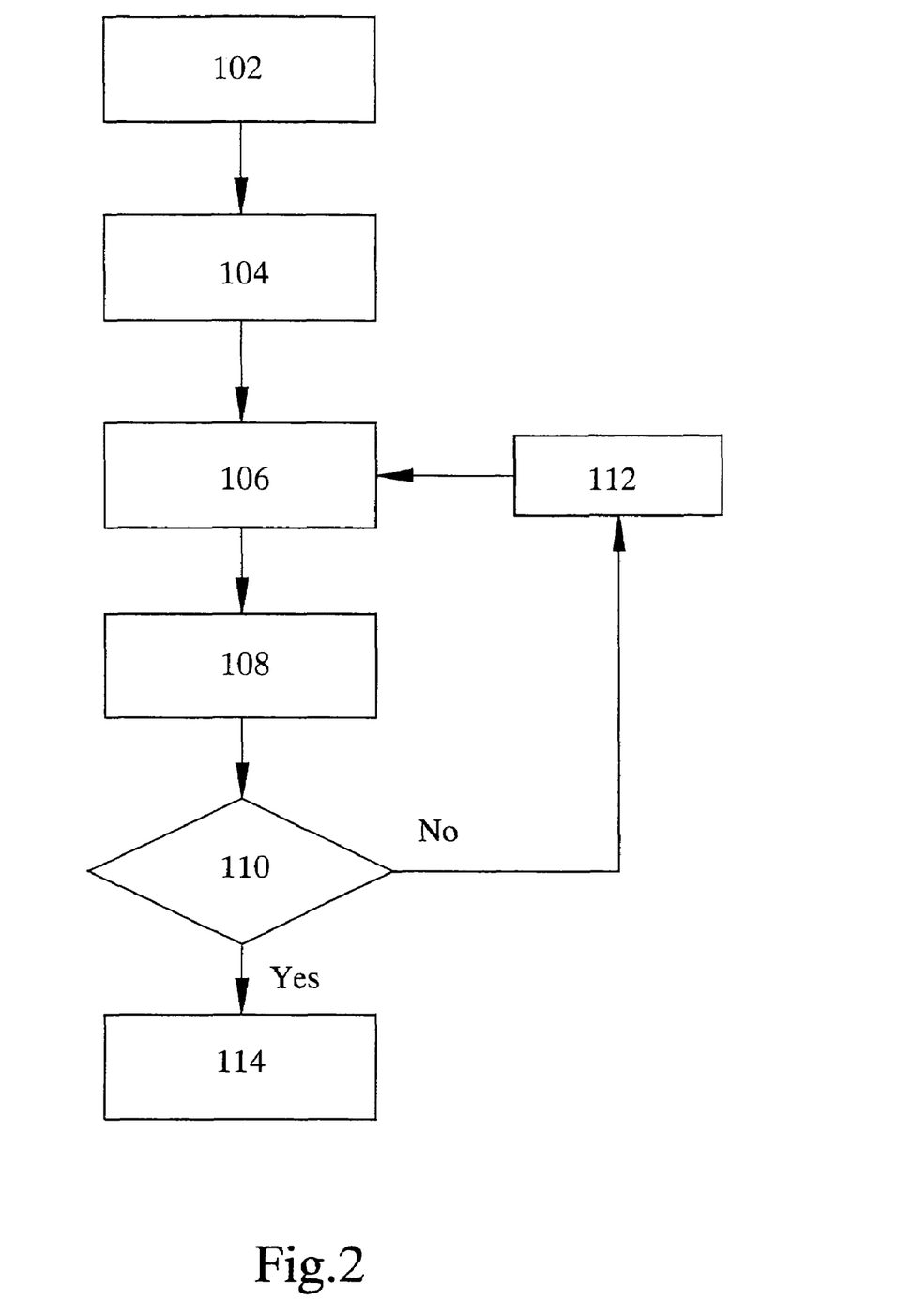
FIG. 2 shows the flow process diagram of the reduced circuit by employing the non-Symmetric Lanczos Algorithm.

To calculate the reduced model of very-large IC interconnects, the well-known non-symmetric Lanczos Algorithm (P. Feldmann and R. W. Freund, "Efficient Linear Circuit Analysis by Pade Approximation via Lanczos Process", IEEE Trans. on CAD of ICS, Vol. 14, No. 5, 1995) is employed to set up two projection matrixes $V_q$ and $W_q$ and to generate reduced models by two-sided projections, with the pseudo code of the algorithm as shown in FIG. 1. The algorithm is required to provide an order q of the reduced model. To keep the characteristic consistency of the reduced model and the original system, it is required to increase the order q. However, in order to minimize the computational complexity in system simulation, it is required to reduce the order q. To address the aforesaid tradeoff, the present invention attempts to improve original non-symmetric PVL and to judge the iteration termination conditions during computation. It aims to realize a maximum accuracy nearby expand frequency point under the lowest level of computational complexity, with the improved flow process as shown in FIG. 2. With input parameters of various passive components in the original circuit in Step (102), it is possible to establish the corresponding Modified Nodal Analysis Equation for comparison of the reduced circuit model. In Step (104), a projection technique of the original circuit is applied to generate a reduced-order system by firstly setting the order of the reduced model q=1. In Step (106), the non-symmetric Lanczos Algorithm is used to input matrix A and its transpose matrix as well as two original vectors b and c', thereby obtaining bi-orthogonal matrix $V_q=[v_1,v_2,\Lambda,v_q]$ and $W_q=[w_1,w_2,\Lambda,w_q]$, namely: $W_q'V_q=I$, of which $I \in R^{q \times q}$. Moreover, $V_q$ exists in Krylov Subspace $K_q(A,b)=\text{span}\{\lfloor b\ Ab\ A^2 b\ \Lambda\ A^{q-1}b \rfloor\}$, which can be developed from the Basis of $K_q$. Meanwhile, $W_q$ exists in Krylov Subspace $L_q(A',c',)=\text{span}\lfloor c'(A')c'(A')^2 c'\Lambda(A')^{q-1}c'\rfloor\}$, which can be developed from the Basis of $L_q$. Futhermore, every iteration process will yield new bi-orthogonal vectors $v_q$ and $w_q$. In addition, the original system's matrix A can be reduced to a tri-diagonal matrix according to the non-symmetric Lanczos Algorithm:

$$T_q = \begin{bmatrix} \alpha_1 & \beta_2 & & & & \\ \delta_2 & \alpha_2 & \beta_3 & & & \\ & \delta_3 & \alpha_3 & \beta_4 & & \\ & & \delta_4 & 0 & 0 & \\ & & & 0 & 0 & \beta_q \\ & & & & \delta_q & \alpha_q \end{bmatrix}$$

The calculation of the aforesaid matrixes will satisfy:

$$AV_q = V_q T_q + \delta_{q+1} v_{q+1} e_q^t \qquad (7)$$

$$A'W_q = W_q T_q' + \beta_{q+1} w_{q+1} e_q^t \qquad (8)$$

and $W_q'AV_q = T_q$, where $e_q$ is a q-th row vector in the unit matrix $I \in R^{q \times q}$.

Owing to the error of moment between the reduced model and the original model, formula (7) and (8) can be expressed as the following three-term recursive equations in order to reduce efficiently the computation of system analysis and minimize the error:

$$Av_q = \beta_q v_{q-1} + \alpha_q v_q + \delta_{q+1} v_{q+1} \qquad (9)$$

$$A'w_q = \delta_q w_{q-1} + \alpha_q w_q + \beta_{q+1} v_{q+1} \qquad (10)$$

Since $\delta_{q+1}$ can be treated as the component of new vector $v_{q+1}$ in $AV_q$, and $\beta_{q+1}$ treated as the component of new vector $w_{q+1}$ in $A'W_q$, Step (108) selects $\delta_{q+1}$ and $\beta_{q+1}$ as a reference indicator. Similarly, Step (110) takes $$\lambda_q = \left\| \frac{\delta_{q+1}}{AV_q} \right\|,$$

$$\mu_q = \left\| \frac{\beta_{q+1}}{A'W_q} \right\|$$

as an indicator for terminating the iteration process. Assuming that $\lambda_q$ and $\mu_q$ are less than tolerance $\epsilon$ for termination conditions, the reduced system will be very similar to the original system. If the above-specified conditions are not met, the order of the reduced model will be gradually increased in Step (112). Every iteration will generate new bi-orthogonal vectors $v_q$ and $w_q$ as well as new and $\delta_{q+1}$ and $\beta_{q+1}$. When both $\lambda_q$ and $\mu_q$ meets the conditions as specified in Step (110), the non-symmetric Lanczos Algorithm iteration process will be stopped, in such case q is an optimal order of the reduced model. In Step (114), order q is used for reduction of the system model.

Addition of Perturbed System

In the original interconnect circuit system, an Additive Perturbation Matrix can be added to demonstrate the reliability of this method. Suppose that the Modified Nodal Analysis Equation of the circuit is:

$$(A-\Delta)\frac{dx_\Delta(t)}{dt} = x_\Delta(t) - ru(t), \quad y_\Delta(t) = c^T x_\Delta(t) \tag{11}$$

Where, $\Delta$ represents the additive perturbations of the system:

$$\Delta = \Delta_1 + \Delta_2 \tag{12}$$

Where, $\Delta_1 = v_{q+1}\delta_{q+1}w_q^t$, $\Delta_2 = v_q\beta_{q+1}w_{q+1}^t$, and q is the order of the reduced model.

The transfer function of the reduced model of the original circuit can be expressed as $\hat{H}(s)$, as shown in formula (6). Under the condition of the formula (12), the transfer function $H_\Delta(s)$ of the original system plus the perturbed system will be equal to the transfer function $\hat{H}(s)$ of the reduced system. Assume the expend frequency point $s=s_0+\sigma$, and $l'r=(\beta_1 w_1)\delta_1 v_1 = \beta_1\delta_1(w_1^t v_1) = \beta_1\delta_1$, the transfer function of the reduced model can be simplified as:

$$\hat{H}(s_0+\sigma) = \hat{l}'(I_q - \sigma\hat{A})^{-1}\hat{r} \tag{13}$$
$$= l'V_m(I_q - \sigma T_q)^{-1}W_m' r$$
$$= \beta_1 w_1' V_q (I_q - \sigma T_q)^{-1} W_q' v_1 \delta_1$$
$$= (l'r)e_1'(I_q - \sigma T_q)^{-1}e_1.$$

The transfer function of the perturbed system can be simplified as:

$$H_\Delta(s_0+\sigma) = l'(I_n - \sigma(A-\Delta))^{-1} r \tag{14}$$
$$= w_1'\beta_1(I_n - \sigma(A-\Delta))^{-1}\delta_1 v_1$$
$$= (l'r)w_1'(I_n - \sigma(A-\Delta))^{-1}v_1.$$

By using formula (7), it can be shown that various moments of the reduced model via PVL method are equivalent to those of the original model with the additive perturbed system $\Delta$. Firstly, subtracting $\Delta V_q$ at both sides of the equation, the right side of the equation can be reduced as:

$$V_q T_q + \delta_{q+1}v_{q+1}e_q' - \Delta V_q = V_q T_q + \delta_{q+1}v_{q+1}e_q' - (v_{q+1}\delta_{q+1}w_q'^t + v_q\beta_{q+1}w_{q+1}^t)V_q = V_q T_q$$

Formula (7) can be rewritten as:

$$AV_q - \Delta V_q = V_q T_q + \delta_{q+1}v_{q+1}e_q' - \Delta V_q (A-\Delta) V_q = V_q T_q$$

If $-\sigma$ is multiplied and $V_q$ is added at both sides of the aforesaid equation, it can be rewritten as:

$$V_q - \sigma(A-\Delta)V_q = V_q - \sigma V_q T_q \tag{15}$$

Thus $$(I_n - \sigma(A-\Delta))V_q = V_q(I_q - \sigma T_q) \tag{16}$$

If $(I_n-\sigma(A-\Delta))^{-1}$ is multiplied at the matrix left of the equation, and $(I_q-\sigma T_q)^{-1}$ is multiplied at the matrix right of the equation, then formula (16) can be rewritten as:

$$V_q(I_q - \sigma T_q)^{-1} = (I_n - \sigma(A-\Delta))^{-1}V_q \tag{17}$$

Finally, $w_1'$ is multiplied at the matrix left of the equation, $e_1$ is multiplied at the matrix right of the equation, and constant $l'r = \beta_1\delta_1$ is multiplied at both sides, then:

$$w_1'V_q(I_q-\sigma T_q)^{-1}e_1 = w_1'(I_n-\sigma(A-\Delta))^{-1}V_q e_1 \ (l'r)e_1'(I_q-\sigma T_q)^{-1}e_1 = (l'r)w_1'(I_n-\sigma(A-\Delta))^{-1}v_1 \tag{18}$$

By comparing formula (19) and (13)/(14):

$$\hat{H}(s_0+\sigma) = H_\Delta(s_0+\sigma) \tag{19}$$

The reduced model derived from the aforementioned equations demonstrates the nom-symmetric PVL Algorithm, where various moments of the transfer function are equal to those of the original system with the additive perturbed system $\Delta$.

Figure 3:
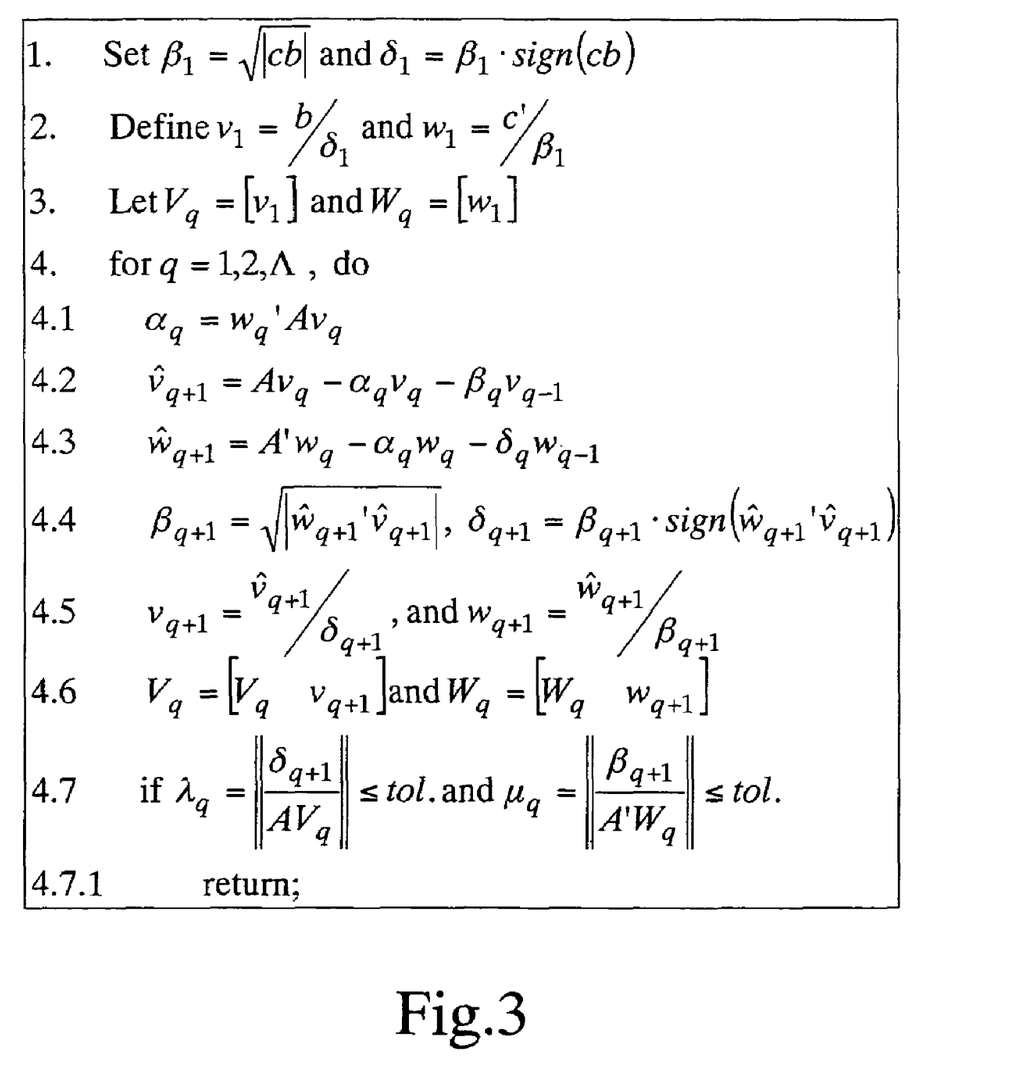
FIG. 3 shows the pseudo code of an improved non-Symmetric Lanczos Algorithm.

The model reduction method of the present invention for high-speed very-large IC employs an improved non-symmetric Lanczos Algorithm, with its pseudo code shown in FIG. 3.

SIMPLE EMBODIMENT OF THE INVENTION

Figure 4:
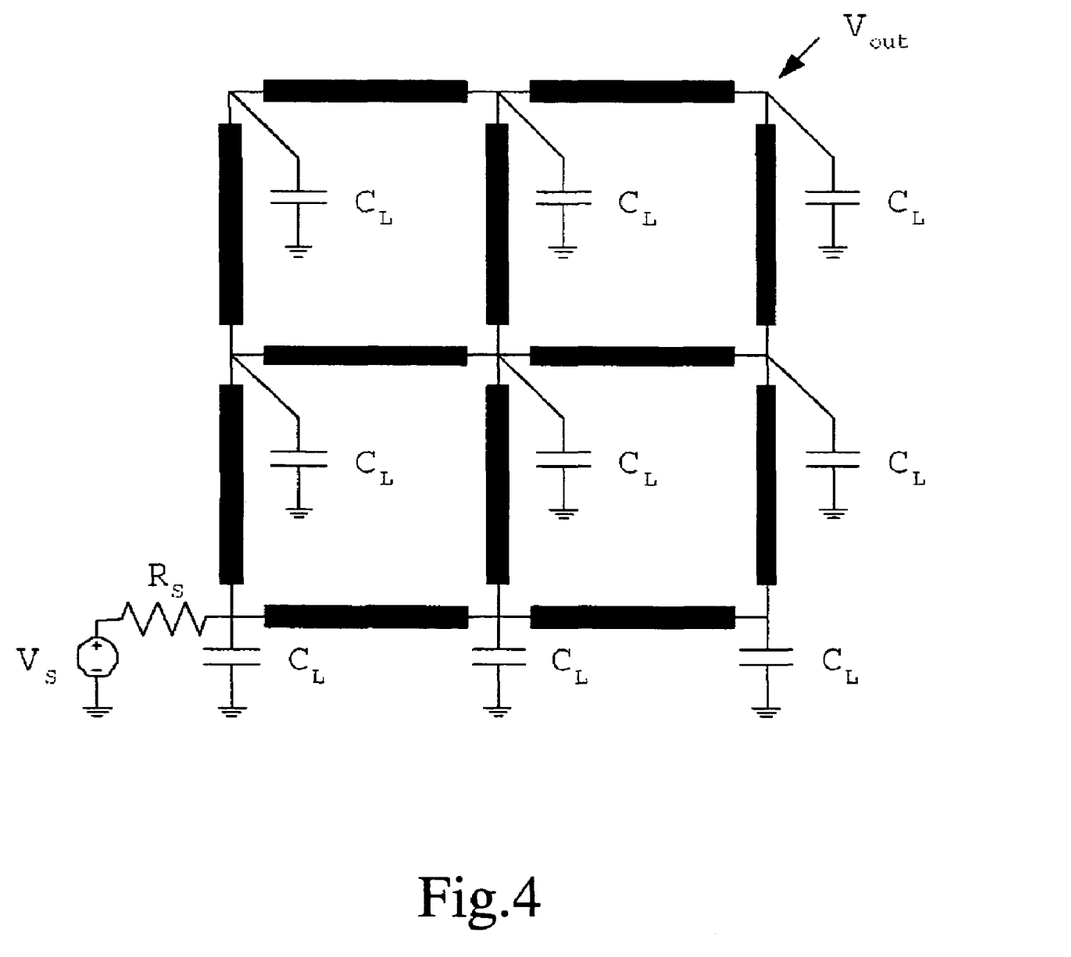
FIG. 4 shows the simplified embodiment of the present invention.
Figure 5:
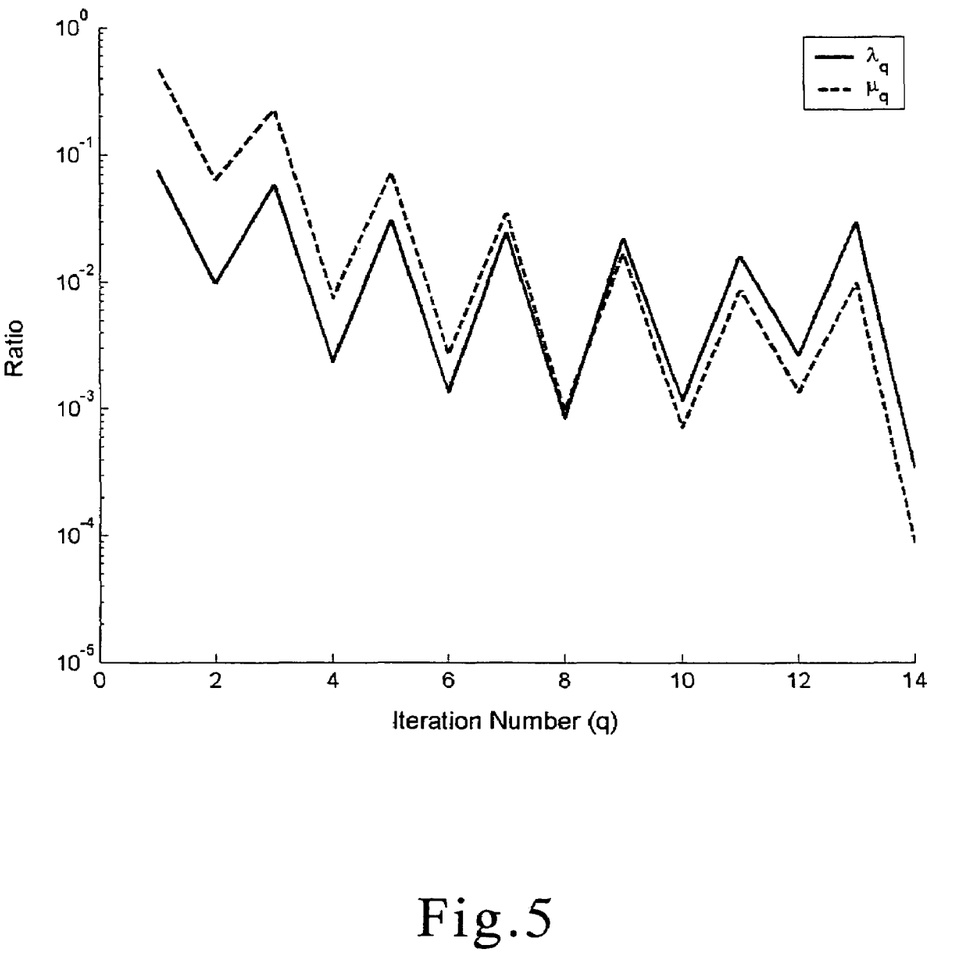
FIG. 5 shows the curve diagram of termination conditions of the present invention.
Figure 6:
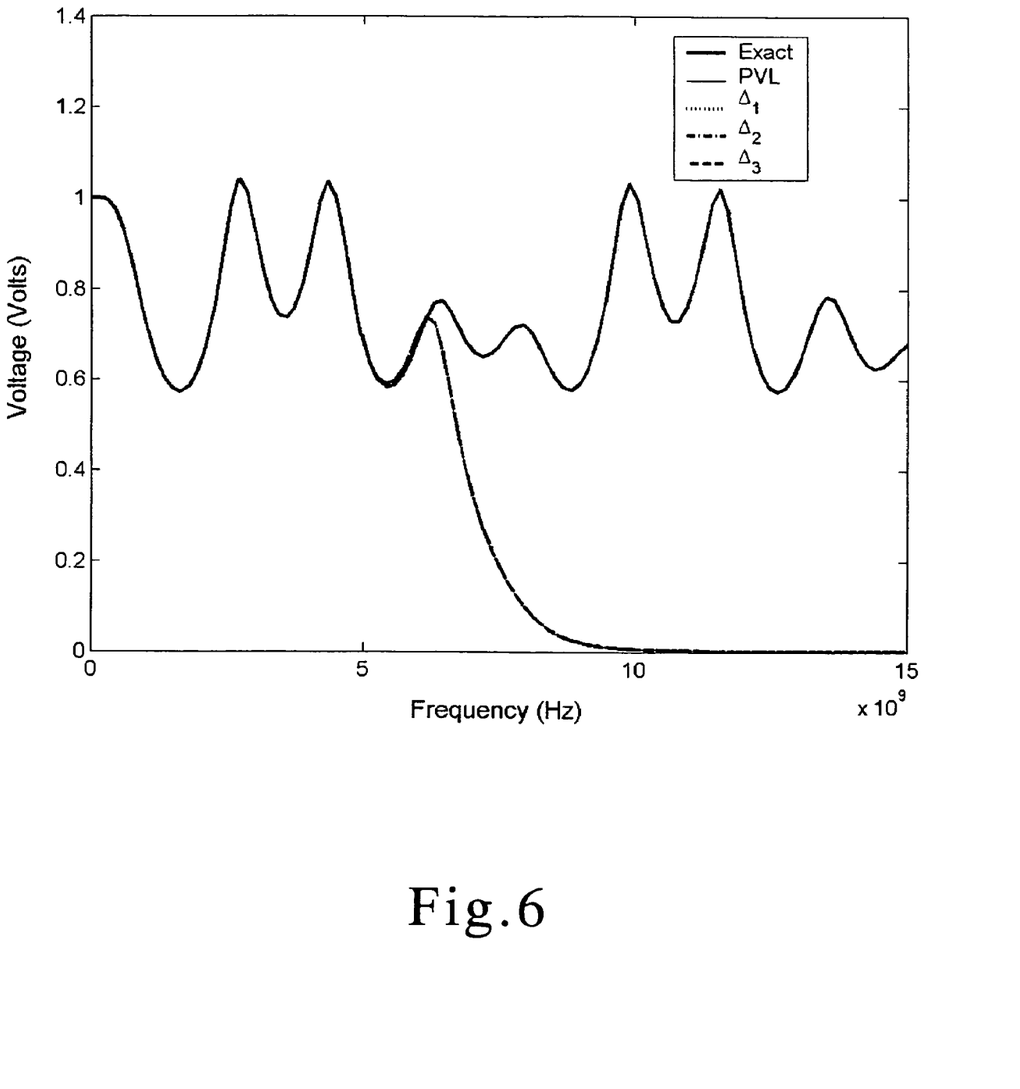
FIG. 6 shows the frequency response diagram of the simplified embodiment.
Figure 7:
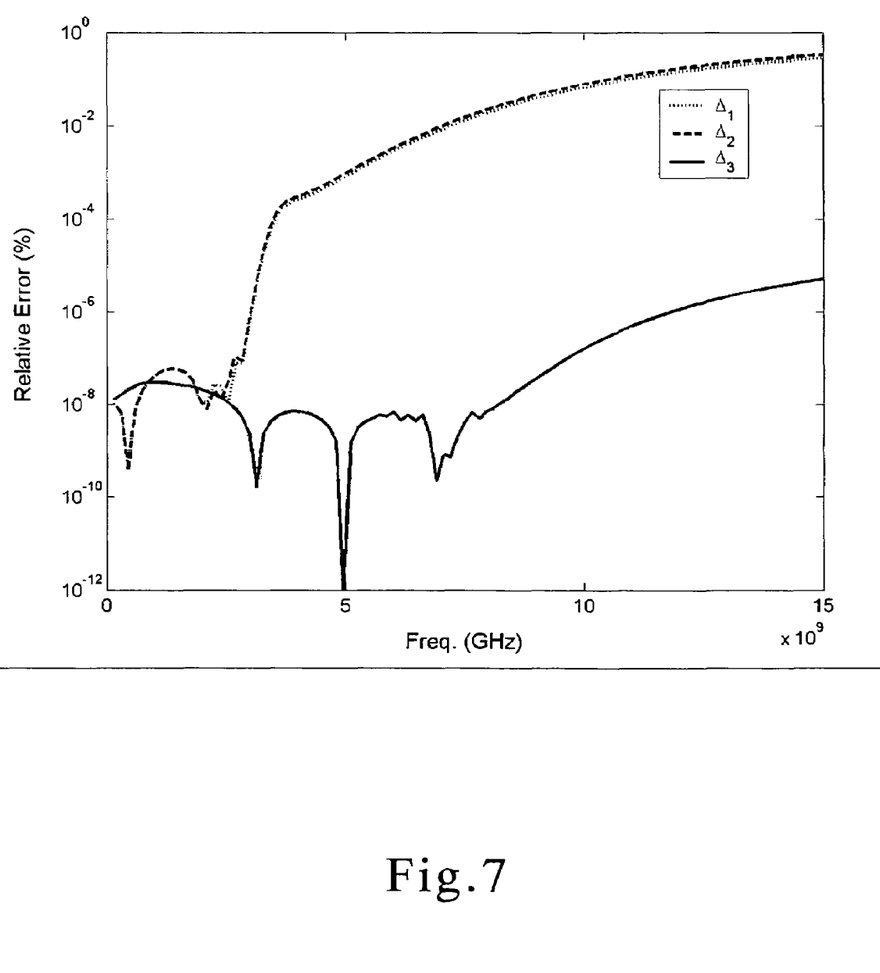
FIG. 7 shows the error analysis of reduced-order models of the simplified embodiment.
Figure 8:
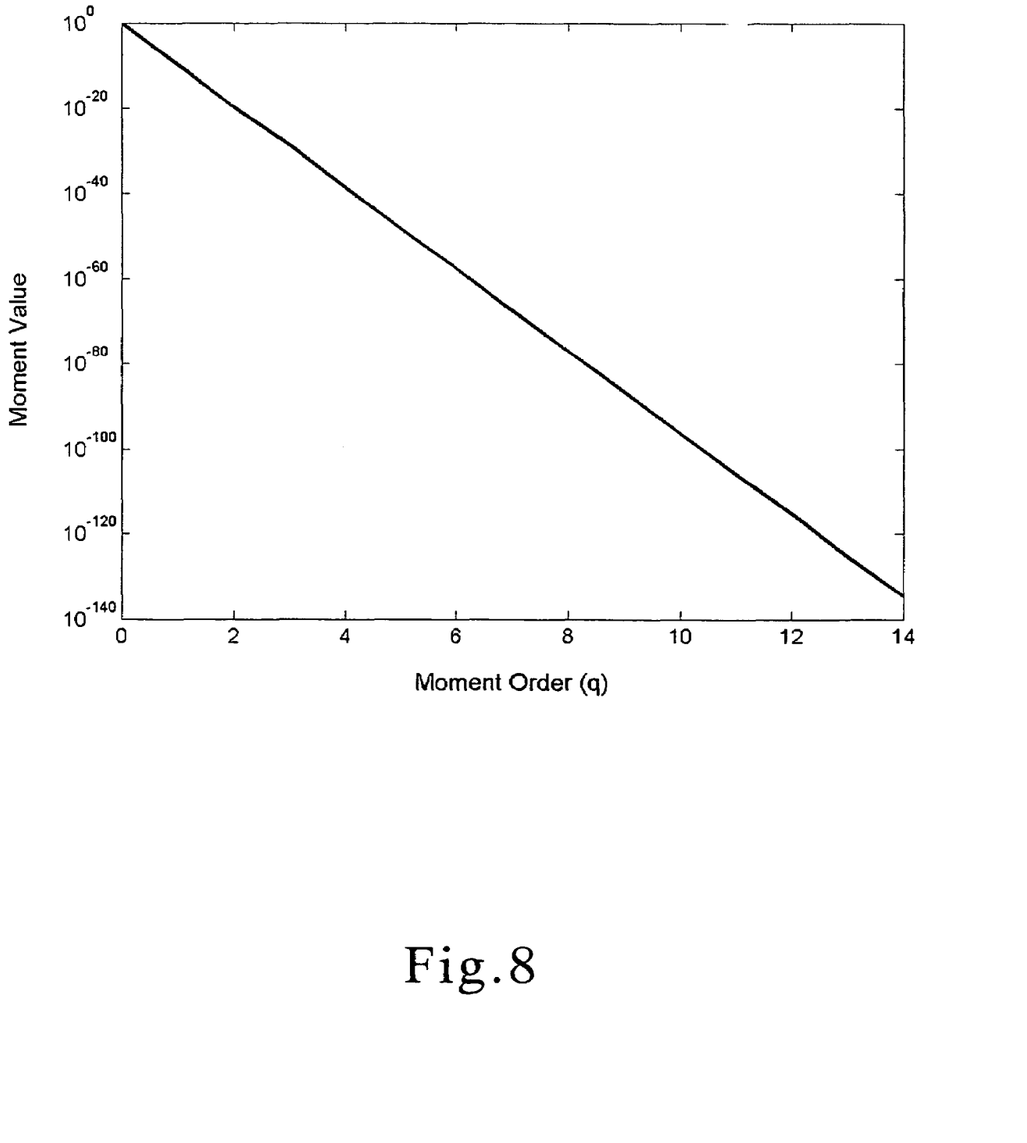
FIG. 8 shows the analysis pattern of order of the simplified embodiment and moment value of the system.

The present invention tests a simple embodiment in order to verify the validity of the proposed algorithm. FIG. 4 depicts circuit model with 12 lines. The line parameters are: resistance: $1.0\Omega$/cm; capacitance: 5.0 pF/cm; inductance: 1.5 nH/cm; driver resistance: $3\Omega$, and load capacitance: 1.0 pF. Each line is 30 mm long and divided into 10 sections. Thus, the dimension of MNA matrix is: n=238. Under a frequency from 0 to 15 GHZ, it should be possible to observe the frequency response of $V_{out}$ node voltage of the embodiment and to set the expand frequency point of the reduced model $s_0 = 0H_z$. If the non-symmetric Lanczos Algorithm is performed, the values of $\beta_{i+1}$ and $\delta_{i+1}$ are recorded in the tri-diagonal matrix. If the non-symmetric Lanczos Algorithm iteration process is enabled and the tolerance error of termination conditions $\epsilon = 10^{-3}$, i.e. $u_q < 10^{-3}$ is set, it is should be possible to obtain the optimal solution of accuracy and reduce computational complexity when the reduced model is q=14. FIG. 5 depicts the curve diagram of termination conditions $$\lambda_q = \left\| \frac{\delta_{q+1}}{AV_q} \right\|,$$

$$\mu_q = \left\| \frac{\beta_{q+1}}{A'W_q} \right\|$$

during computational process of the algorithm. FIG. 6 shows the frequency response diagram of the reduced model, where H(s), Ĥ(s) and $H_\Delta$(s) represent respectively the transfer function of the original circuit, the transfer function of the system after performing the non-symmetric Lanczos order-reduction method, and the transfer function of the original circuit with the additive perturbed system. As shown in FIG. 6, the analysis of three perturbations involves $\Delta_1$, $\Delta_2$ and $\Delta$ perturbed systems. FIG. 7 analyzes the error between three perturbed systems and the applied non-symmetric Lanczos Algorithm. Thus, the perturbed system $\Delta$ will vary from the reduced-order system and will maintain a high-level consistency with the non-symmetric Lanczos Algorithm. As illustrated in FIG. 8, the moment values of the system are observed. With the increase of order, the moment values are far less than the floating accuracy of the operating system (EPS, about 2.22e-16). So, the error arising from inaccuracy of operational factors may be ignored.

In brief, the present invention has derived very-large RLC interconnects and implemented the model reduction method by employing the non-symmetric Lanczos Algorithm, thereby helping to judge automatically the order of the reduced model while maintaining the accuracy and reducing computation complexity. At the same time, the present invention also derived that the transfer function of the original circuit with additive perturbations can represent an approximation transfer function. The perturbation matrix is related to the component generated by the non-symmetric Lanczos Algorithm, so the computational quantity is very small.

The above-specified, however, are only used to describe the operating principle of the present invention, but not limited to its application range. However, it should be appreciated that a variety of embodiments and various modifications are embraced within the scope of the following claims, and should be deemed as a further development of the present invention.

What is claimed is:

1. A method of determining and building a high-speed VLSI reduced-order interconnect, comprising:
    a) accessing an interconnect in VLSI to be analyzed and creating a mathematical model based on electrical parameters including resistance, capacitance, inductance, coupling capacitance, and mutual inductance of the interconnect;
    b) feeding an expand frequency point based on a predetermined operating frequency;
    c) performing a non-symmetric Lanczos Algorithm;
    d) determining an order of reduced model for model reduction based on iteration termination conditions;
    e) performing a projection algorithm;
    f) creating a reduced system;
    g) inputting the reduced system into a signal analyzer for a high-speed and very-large IC interconnect; and
    h) analyzing the reduced system and building an interconnect using the reduced system, wherein the model reduction method has a transfer function of the perturbed system equal to the transfer function H(s) of original system, and a transfer function $H_\Delta$(s) of modified nodal analysis expressed as follows:

$$(A - \Delta)\frac{dx_\Delta(t)}{dt} = x_\Delta(t) - ru(t), \quad y_\Delta(t) = c^T x_\Delta(t)$$

where, $\Delta = v_{q+1}\delta_{q+1}w_q' + v_q\beta_{q=1}w_{q=1}'$, q is the order of reduced model employed the non-symmetric Lanczos Algorithm comprising:
    1) inputting a state equation of a target system;
    2) selecting an expand frequency point of a reduced system;
    3) determining an order of the reduced system;
    4) performing the non-symmetric Lanczos Algorithm to create a projection matrix;
    5) performing a double projection on state variables by means of the projection matrix to obtain a state equation of the reduced system; and
    6) simulating by applying the state equation of the reduced system, while $\delta_{q+1}$ and $\beta_{q+1}$ are obtained from computational process of reduced system; and the transfer function $H_\Delta$(s) of perturbed system is equal to transfer function Ĥ(s) of reduced system.

2. The method of claim 1, including iteration termination conditions that satisfy the order q of:

$$\lambda_q = \left\|\frac{\delta_{q+1}}{AV_q}\right\| \le \varepsilon \text{ and } \mu_q = \left\|\frac{\beta_{q+1}}{A'W_q}\right\| \le \varepsilon$$

for $\epsilon$ is less than 1/100 of the first iteration.

* * * * *